(12) United States Patent
Gallo et al.

(10) Patent No.: US 7,271,620 B2
(45) Date of Patent: *Sep. 18, 2007

(54) VARIABLE IMPEDANCE OUTPUT BUFFER

(75) Inventors: Girolamo Gallo, Via Saragat (IT);
Giulio Marotta, Via Fontecerro (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/601,263

(22) Filed: Nov. 17, 2006

(65) Prior Publication Data

US 2007/0063730 A1    Mar. 22, 2007

Related U.S. Application Data

(63) Continuation of application No. 11/358,235, filed on Feb. 21, 2006, now Pat. No. 7,161,376, which is a continuation of application No. 10/700,997, filed on Nov. 4, 2003, now Pat. No. 7,034,575.

(30) Foreign Application Priority Data

Feb. 27, 2003   (IT)   .................. RM2003A0085

(51) Int. Cl.
    *H03K 19/0175*    (2006.01)

(52) U.S. Cl. .......................................... 326/87; 326/27
(58) Field of Classification Search ................ 326/37, 326/38, 26, 27, 80–90
See application file for complete search history.

(56) References Cited

U.S. PATENT DOCUMENTS

| | | |
|---|---|---|
| 4,829,199 A | 5/1989 | Prater |
| 5,122,690 A | 6/1992 | Bianchi |
| 5,559,447 A | 9/1996 | Rees |
| 5,804,987 A | 9/1998 | Ogawa |
| 5,894,238 A | 4/1999 | Chien |
| 6,060,921 A | 5/2000 | Daniell |
| 6,177,819 B1 | 1/2001 | Nguyen |
| 6,184,730 B1 | 2/2001 | Kwong et al. |
| 6,236,237 B1 | 5/2001 | Wong et al. |
| 6,288,563 B1 | 9/2001 | Muljono et al. |
| 6,608,505 B2 | 8/2003 | Tsuji |

*Primary Examiner*—Don Le
(74) *Attorney, Agent, or Firm*—Leffert Jay & Polglaze, P.A.

(57) ABSTRACT

An output buffer for a semiconductor memory device and other semiconductor devices includes a feedback circuit to dynamically control the output impedance of the output buffer in response to a variety of load conditions, thus reducing output ringing. The output buffer may also include circuitry to support selectively converting the device for operation at a variety of supply voltage ranges without the need for additional mask or process steps.

30 Claims, 4 Drawing Sheets

VARIABLE IMPEDANCE OUTPUT BUFFER

RELATED APPLICATIONS

This is a continuation application of U.S. patent application Ser. No. 11/358,235, filed Feb. 21, 2006 now U.S. Pat. No. 7,161,376, titled "VARIABLE IMPEDENCE OUTPUT BUFFER," which is commonly assigned and incorporated by reference in its entirety herein, and which is a continuation of U.S. patent application Ser. No. 10/700,997 of the same title, filed Nov. 4, 2003, now U.S. Pat. No. 7,034,575, issued Apr. 25, 2006, which is commonly assigned and incorporated by reference in its entirety herein, and which claims priority to Italian Patent Application Serial No. RM2003A000085 of the same title, filed Feb. 27, 2003.

TECHNICAL FIELD OF THE INVENTION

The present invention is related in general to memory devices and more particularly to an output buffer for memory device input/output (I/O) circuitry that provides variable output impedance for improved signal integrity and support for an expanded range of operating voltages.

BACKGROUND OF THE INVENTION

Cellular telephone systems and other portable electronic devices of different manufacture each have their own particular operating characteristics. Meeting these diverse requirements has presented a challenge for component manufacturers. For example, manufacturers of memories for the wireless and portable electronic device market typically offer a variety of memory devices to meet the specifications for different manufacturers. Accordingly, the development and production cost of memory devices for such applications is significantly affected.

One application requirement that varies widely among cellular telephone system manufacturers is the main power supply voltage. While most cellular telephone manufactures have migrated to very low power platforms (VCC=1.65V-2.0V) a large number of applications still require a 3V input output (I/O) interface (VCCQ=2.7V-3.3V). As a consequence, flash memory manufactures typically offer, in addition to full low-voltage devices having both the memory core and I/O interface powered at 1.8V, mixed-power supply devices having a 1.8V main power supply and a 3V I/O interface. Moreover, in the future, manufacturers may decide to migrate to systems having even lower main power supply voltages. Since full low-voltage and mixed-voltage devices typically use different I/O buffer circuits, the two versions essentially present two different design projects and their fabrication requires the generation of two different sets of masks.

Another application requirement that varies from one cellular system to another is I/O load impedance. The large variability of load transmission line characteristics, i.e., the capacitance, inductance, and resistance of the load, renders it very difficult to optimize buffer drive strength. For example, drive strength adequate for a 30 pF load, may result in a noisy output signal due to signal ringing. Signal ringing must of course be avoided while still switching as fast as possible to meet the high-speed performance requirements of modern integrated circuits and designs. The above-mentioned problems, as well as other problems, are addressed at least in part by the present invention and will be understood by reading and studying the following specification.

DETAILED DESCRIPTION

Figure 1:
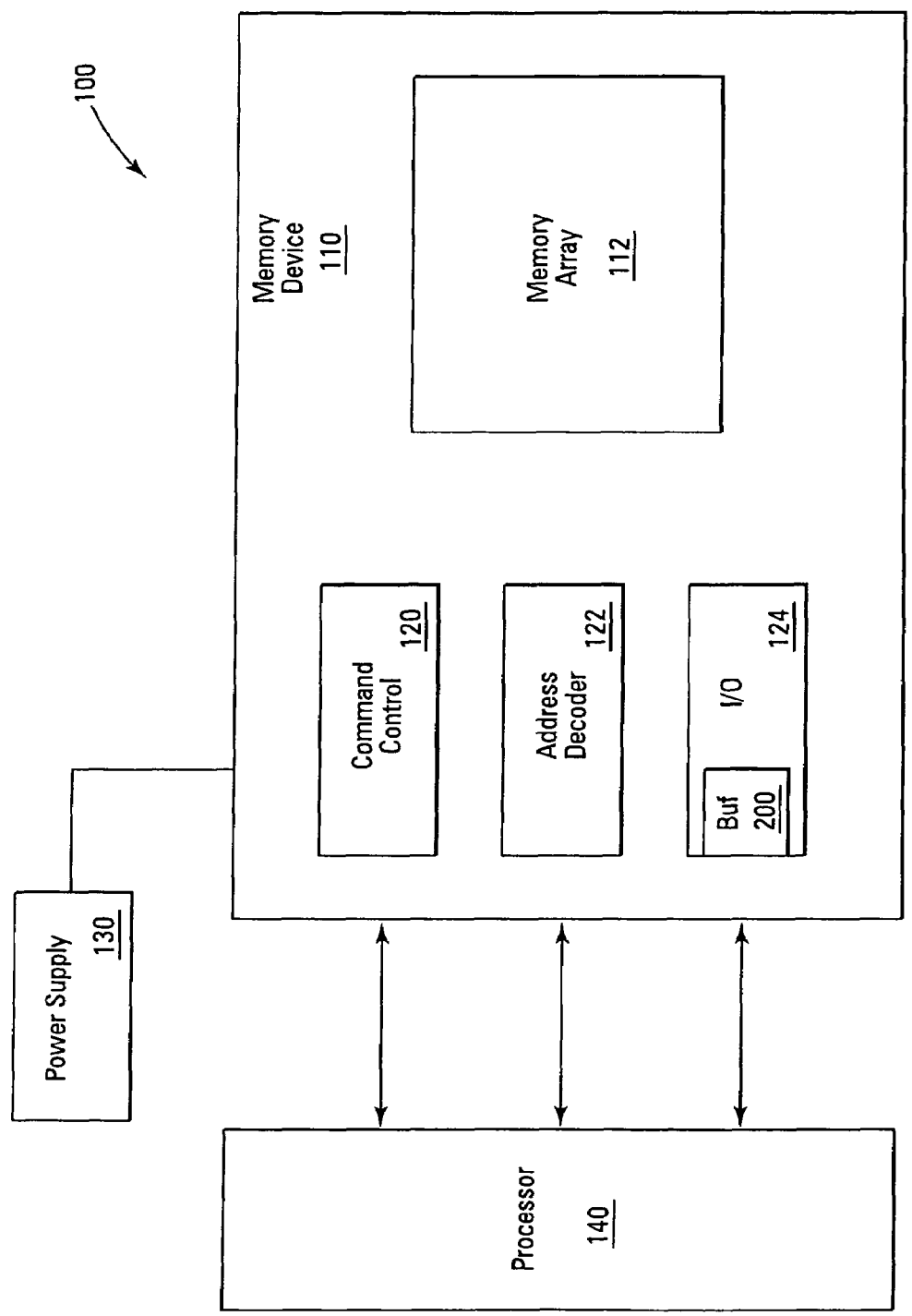
FIG. 1 shows a system including a processor, a memory circuit, a power supply, and an I/O circuit according to the teachings of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 shows a simplified block diagram of an electronic system 100 including a memory circuit 110, a power supply 130 and a processor 140. Memory 110 includes a memory array 112 of nonvolatile memory cells such as flash memory, and a command control circuit 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an input/output (I/O) circuit 124 for providing bidirectional communications between processor 140 and memory circuit 110. In particular, I/O circuit 124 includes an output buffer circuit 200 for providing optimal output signal levels to devices external to the memory circuit 110. For purposes of simplicity of explanation, the memory circuit 110 will be described in the context of flash memory, although one skilled in the art will recognize that other types of memory circuits, such as, for example, dynamic random access memory (DRAM), static random access memory (SRAM), or electrically erasable read only memory (EEPROM), as well as other integrated circuit or semiconductor devices, also may implement an output buffer in accordance with one or more aspects of the present invention. Similarly, the flash memory may be of a NOR or NAND architecture, asynchronous or synchronous, and may employ a virtual segment architecture.

Figure 2:
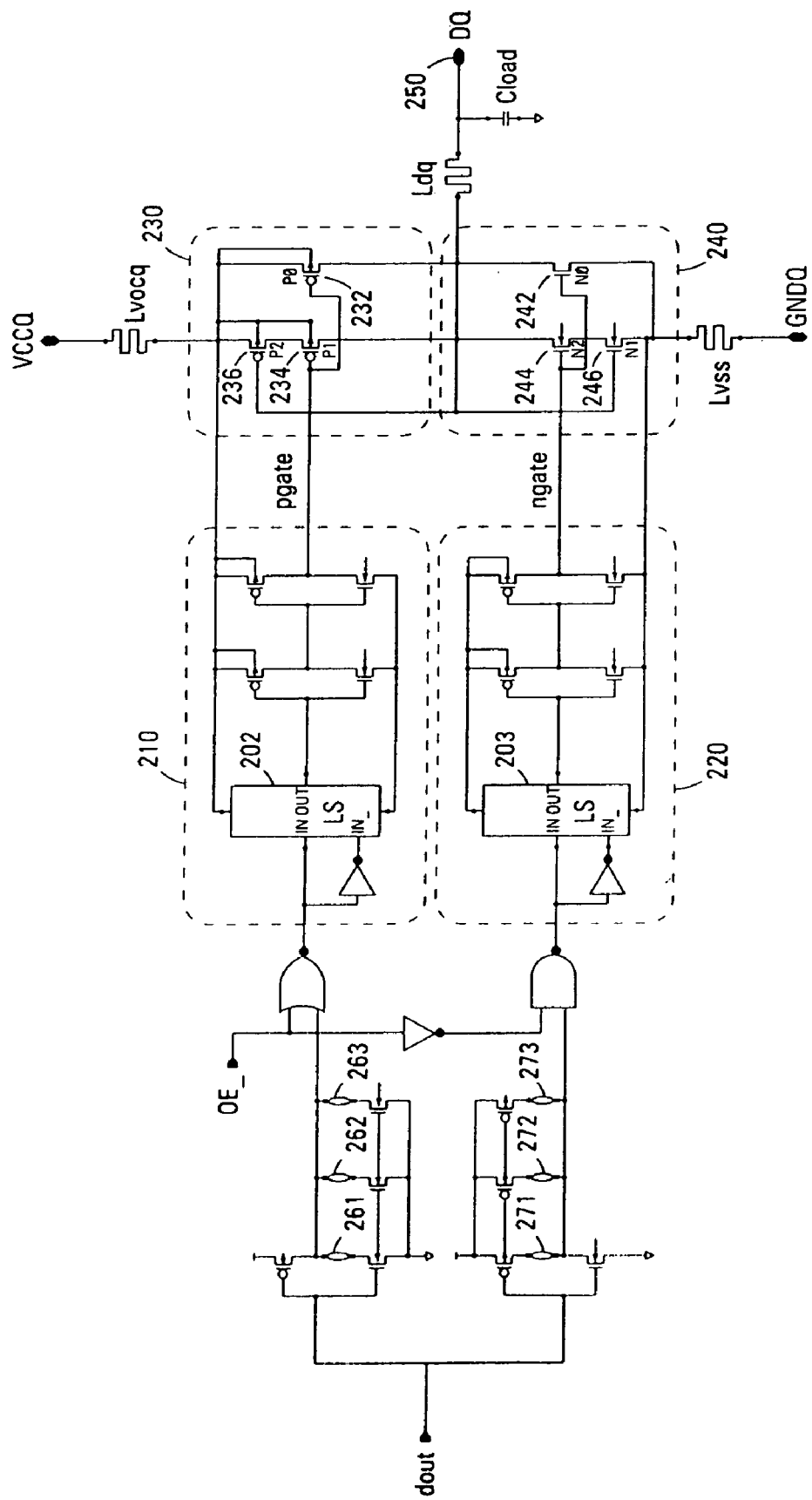
FIG. 2 shows an illustration of one embodiment of an I/O circuit according to the teachings of the present invention.

A simplified schematic diagram of an embodiment of an output buffer circuit 200 according to the present invention is shown in FIG. 2. In this example, output buffer circuit 200 may operate in the so called "extended low-voltage range" (VCC=1.6-2.0V and VCCQ=1.6V-2.3V). In other embodiments of the present invention, as will be described below, an output buffer circuit according to the present invention may be converted to a circuit capable of operating in a wider voltage range (VCCQ=1.6-3.3V) without the need for additional masks or process steps.

Output buffer circuit 200 includes four main blocks: a pull-up pre-driver section 210, a pull-down pre-driver section 220, a pull-up output driver section 230, and a pull-down output driver section 240.

The pull-up output driver section 230, which is driven by the corresponding pull-up pre-driver section 210, includes pull-up transistor (P0) 232 and cascode-connected transistors 234 and 236 (P1 and P2) coupled between the output pad (DQ) 250 and the I/O power supply node, VCCQ, adapted to receive a supply voltage. The gates of pull-up transistors (P0) 232 and (P1) 234 are driven by the signal pgate, generated by the pull-up pre-driver section, while the gate of pull-up transistor 236 (P2) is directly connected to the output pad 250. The signal provided to the output pad 250 is representative of the data signal DOUT, and thus representative of a data value of a cell of the memory array.

Similarly, pull-down output driver section 240, driven by the corresponding pull-down pre-driver section 220, includes pull-down transistor 242 (N0) and cascode-connected transistors 244 and 246 (N1 and N2) coupled between output pad DQ 250 and the I/O ground node, GNDQ, adapted to receive a supply ground potential. The gates of pull-down transistors 242 (N0) and 244 (N1) are driven by the signal ngate, generated by pull-down pre-driver section 220, while the gate of transistor 246 (N2) is directly connected to DQ pad 250. Input signals to the pre-driver sections 210 and 220 include output enable signal OE_ and data signal DOUT. Output signals from pre-driver sections 210 and 220 are pgate and ngate, respectively, which are both indicative of the data signal DOUT and which control the gates of the pull-up and pull-down drivers, respectively. The signals ngate and pgate generally maintain the same logic level, but their transitions may be shifted in time.

Output buffer 200 operates essentially as follows. When output enable signal OE_ is set to logic high, the output of buffer 200 is in the high impedance state. When output enable signal OE_ is set to logic 0, the signals pgate, and ngate are enabled and the pull-up and pull-down drivers 230 and 240 may be turned-on according to the DOUT logic value.

Pre-driver sections 210 and 220 each include a level shifter circuit (LS) 202 and 203, respectively for translating the voltage level. Level shifter circuits 202 and 203 advantageously allow operating the buffer with 0-stand-by-power even if the I/O interface supply voltage VCCQ is different from the core memory supply VCC. A more detailed description of level shifter circuits 202 and 203 is provided below with reference to FIG. 3.

The cascode configuration of the driver transistors in the pull-up and pull-down driver sections provides dynamic control of the impedance of the output driver and improves the data output signal rise and fall time. As a result, the output ringing is significantly reduced. The circuit operates essentially as follows. Consider a high to low transition of the data signal. In this case, ngate and pgate signals switch from 0 to VCCQ. Therefore, transistors 232 (P0) and 234 (P1) of the pull-up section 230 are switched off and there is no current path between VCCQ and DQ 250. In the pull-down section, at the beginning of the transition, all 3 transistors 242 (N0), 244 (N1) and 246 (N2) are switched on, so the two branches made of transistor 242 (N0) and the cascode-connected transistors 244 (N1) and 246 (N2) both contribute to the load charging current.

As soon as the output voltage decreases and becomes close to the switching threshold (Vtn) of the n-channel transistors, the current path through transistor 244 (N1) and 246 (N2) is progressively switched off and the output current decreases accordingly. When the DQ pad 250 voltage becomes lower than Vtn, transistor 246 (N2) is turned off and the output current is now due to the transistor 242 (N0) path only. This behavior results in increased output impedance when the output is reaching its final GNDQ voltage, so that the output ringing is significantly reduced in a design according to the present invention compared to a conventional output buffer design.

A similar effect is obtained for a low to high to low transition of the data signal resulting from the symmetrical (or dual) cascode circuit introduced in the pull-up driver section 230.

Figure 4:
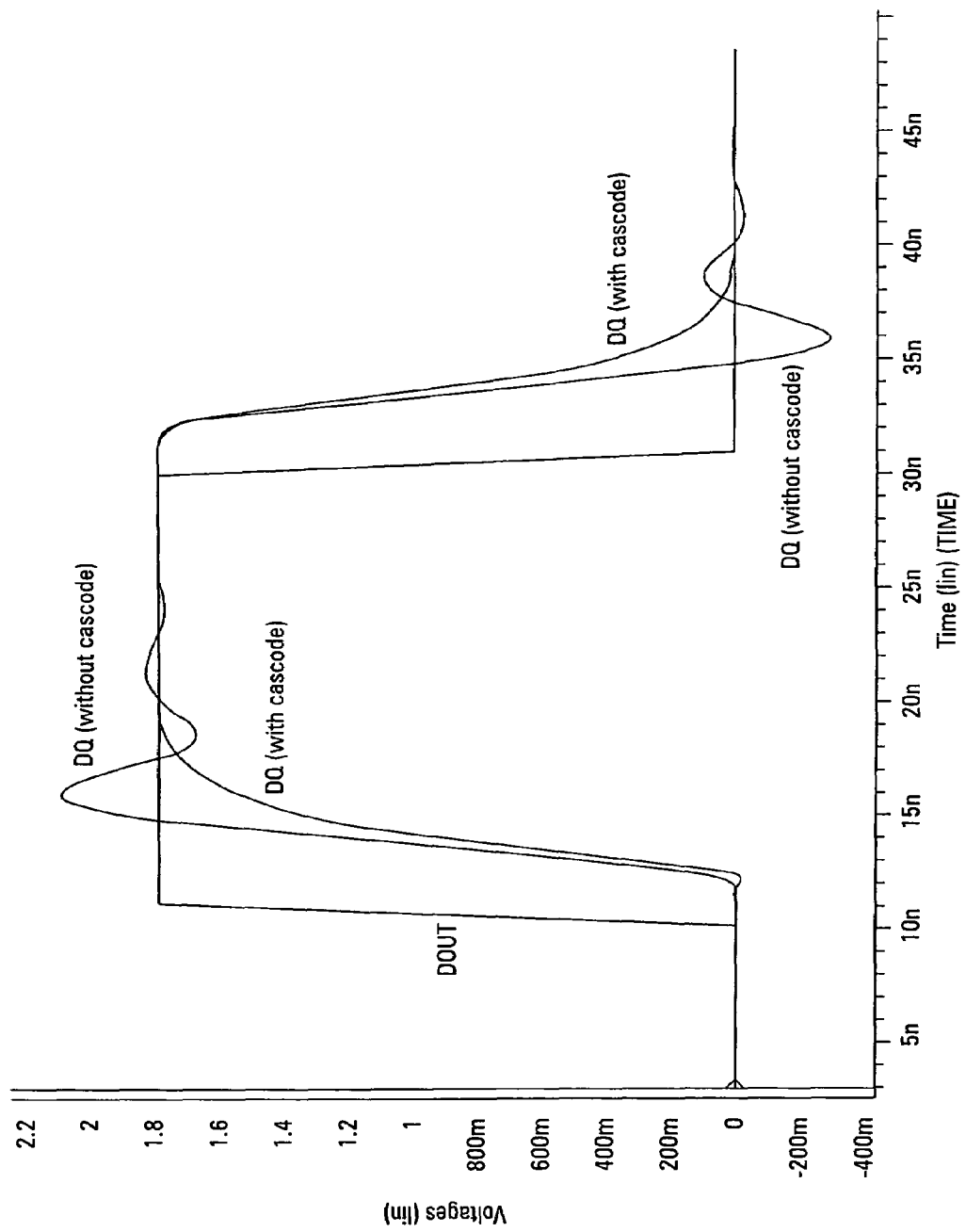
FIG. 4 is a graph showing a comparison of I/O output voltage for a typical I/O for a memory compared with an I/O according to the present invention.

FIG. 4 shows a Spice simulation of results obtained from a circuit model of the embodiment of the output buffer of FIG. 2 according to the present invention. In FIG. 4, the input voltage DOUT is compared to the output voltage DQ from a circuit that does not use the cascoded configuration in the pull-up and pull-down drivers versus the output voltage DQ from an embodiment of an output buffer circuit according to the present invention. Both simulations refer to the following conditions: Lvss=Lvccq=16 nH, Ldq=8 nH, Cload=30 pF. As can be seen, feedback circuitry according to the present invention significantly reduces output ringing, but has a very limited impact on the output buffer delay time.

As mentioned, circuits according to the present invention may be converted to operate in the wider 1.6-3.3V VCCQ range via a 4-layer layout option to support those applications that may require a 3V I/O interface. This conversion basically involves replacing each thin oxide transistor connected to the VCCQ and GNDQ power supplies with a corresponding thick oxide device. The transistors affected by this change are those in the output driver and pre-driver sections, including the voltage shifters. The present invention may be applied to other lower or higher output buffer supply voltage ranges as may be called for by manufacturers of semiconductor memory devices.

In one example, the layout conversion may be accomplished without the need for additional mask or process steps because thick oxides are commonly used in other circuits of the flash device, such as pumps and memory cores, etc. The conversion may be accomplished by changing the poly gate, n+ and p+ levels. Poly gates must also be resized because the minimum length of a thick oxide transistor is generally longer than that of a thin oxide device, while n+ and p+ diffusions correspondingly may be replaced by the corresponding HVn+ and HVp+ levels. Advantageously, the changes mentioned above require only minor layout editing effort since the space for accommodating longer poly gates has been accounted for in advance. Given the difference in I-V characteristics between thin and thick oxide transistors, a small number of changes in one of the metal masks may also be required to better adapt the circuit to operate in the wider VCCQ range. For example, the size of the pull-down stages in the voltage level shifters would need to be increased. In order to customize the circuit for use in a different voltage range, a programmable interconnect may be employed to selectively engage or disengage the circuit elements for the particular voltage range. For example, a device according to the present invention may include a selection system operative to receive a signal to select which voltage range will be operative for the device. For example, in a case when the system is implemented as part of an integrated circuit, the selection system may include one or more metal mask options. The metal mask options may have two or more user-selectable conditions (e.g., different fixed voltage levels), each of which provides a different selection signal, thereby controlling the voltage range of the device. Other programmable interconnects such as jumpers, fusible links, or electrically or optically programmable links, and the like, may also be used for configuration in a post-production process.

Figure 3:
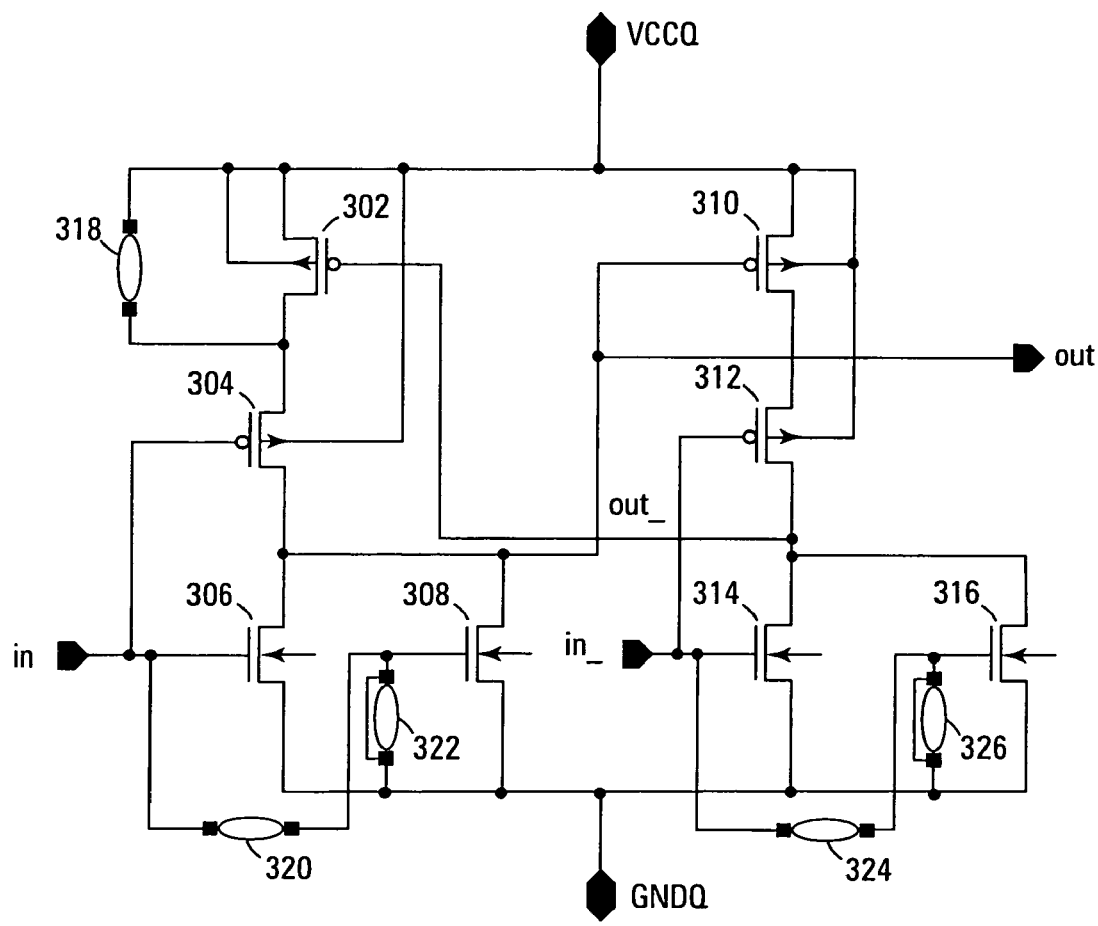
FIG. 3 is a block diagram of one embodiment of a voltage-selectable level shifter circuit according to the teachings of the present invention.

FIG. 3 shows a simplified schematic diagram of one embodiment of a level shifter circuit 300 according to the present invention that may be converted to operation from one voltage range to another by selectively opening or closing metal mask options. Level shifter circuit 300 may be used in place of level shifters 202 and 203 of FIG. 2. Level shifter circuit 300 includes PMOS transistors 302 and 304 coupled in series with NMOS transistor 306 between VCCQ and GNDQ. The gates of NMOS transistor 306 and PMOS transistor 304 are coupled to the input (in) of level shifter 300, which in turn is selectively coupled to the gate of NMOS transistor 308 by metal mask option 320. NMOS transistor 308 is coupled in parallel with NMOS transistor 306. NMOS transistor 308 is also coupled between the gate of PMOS transistor 310 and GNDQ. Metal mask option 322 selectively shunts the gate of NMOS transistor 308 to GNDQ. PMOS transistor 310 is coupled in series to PMOS transistor 312 and NMOS transistor 314 between VCCQ and GNDQ. NMOS transistor 314 is coupled in parallel with NMOS transistor 316. In FIG. 3, closing the metal mask options 320 and 324 and opening metal options 322 and 326 will increase the size of the pull-down stage of the level shifter 300, thus facilitating operation at higher supply voltages. Similarly, if the circuit is operated at VCC=VCCQ, a voltage shift function is not required. In such circumstances, the metal mask option 318 may be closed to force the level shifter circuit to operate like an inverter, resulting in faster operation. In addition to increasing the size of the pull-down and pull-up stages, relatively thick oxide transistors should be used for operation at higher voltages. Thus, in addition to selecting the appropriate metal mask options to affect the size of the pull-down and pull-up stages, the fabrication process would also be modified to adjust the thickness of the gate dielectric of the transistors of the level shifter 300 as appropriate for the chosen operating voltage. While thick oxide transistors could be used at lower operating voltages, thinner oxides are preferable to avoid the resulting speed penalty associated with thicker oxides at lower voltages.

FIG. 2 also shows p_ovlp metal mask options 261, 262 and 263 and n_ovlp metal mask options 271, 272 and 273. One or more of these metal mask options may be opened or closed to fine tune the disoverlap of the ngate and pgate signals, i.e., to ensure that while the ngate signal has a logic level sufficient to activate the NMOS transistors 242 and 244, the pgate signal has a logic level insufficient to activate the PMOS transistors 232 and 234, and vice versa. This is desirable to avoid the unwanted simultaneous conduction of pull-up and pull-down sections of the output driver, which would unnecessarily increase power consumption. This may be accomplished by adjusting the rates of change in the signal levels provided to the pre-driver stages such that a rate of change of the ngate and pgate signals will be relatively quick when transitioning from a logic level adapted to activate their associated driver stage to a logic level adapted to deactivate their associate driver stage and relatively slow when transitioning from a logic level adapted to deactivate their associated driver stage to a logic level adapted to activate their associate driver stage, thus causing an activated driver stage to deactivate prior to activating the other driver stage. Disoverlap is preferably long enough to ensure that simultaneous conduction of pull-up and pull-down sections will not occur. However, increasing levels of disoverlap will delay signal transitions.

CONCLUSION

An output buffer for a memory device has been described. The output buffer includes a feedback circuit to dynamically control the output impedance of the output driver in response to a variety of load conditions, thus reducing output ringing. The output buffer of the present invention may also include circuitry to support operation at a variety of supply voltages without the need for additional mask or process steps by one or more programmable interconnects to select the desired voltage range.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
   an array of memory cells;
   an input/output circuit for providing bi-directional communications and containing an output buffer circuit coupled to the array of memory cells, wherein the output buffer circuit comprises:
   a driver stage comprising one or more drive transistors coupled to receive a signal representative of a data value of a memory cell of the array;
   a pre-driver stage coupled to the driver stage; and
   a feedback circuit to dynamically control output buffer impedance in response to a load condition;
   wherein the feedback circuit comprises cascode-connected drive transistors.

2. The memory device of claim 1, wherein the driver and pre-driver stages comprise pull-up and pull-down sections.

3. The memory device of claim 2, further comprising one or more level shifter circuits.

4. The memory device of claim 3, wherein the output buffer is selectively configurable for operation at a plurality of supply voltages.

5. The memory device of claim 1, further comprising a programmable interconnect to calibrate a rate of change in a signal level input to a pull-up or pull-down section of the output buffer.

6. The memory device of claim 1, wherein the output buffer further comprises a programmable interconnect to selectively configure the output buffer for operation at a predetermined supply voltage range.

7. The memory device of claim 6, wherein the programmable interconnect is programmable after fabrication.

8. A memory device, comprising:
   an array of memory cells;
   an input/output circuit for providing bi-directional communications and containing an output buffer circuit coupled to the array of memory cells, wherein the output buffer circuit comprises:
   a pull-up driver coupled between a power supply node and an output node;
   a pull-down driver coupled between a ground node and the output node;
   a pull-up pre-driver coupled to the pull-up driver; and a pull-down pre-driver coupled to the pull-down driver;
wherein the pull-up and pull-down drivers each comprise a plurality of cascode-connected drive transistors; and
wherein a gate of at least one of the cascode-connected drive transistors in each driver is coupled to the output node.

9. The memory device of claim 8, wherein the pull-up and pull-down pre-driver sections further comprise one or more level shifter circuits.

10. The memory device of claim 9, wherein the one or more level shifter circuits are selectively configurable for operation at a plurality of supply voltages.

11. A memory device, comprising:
an array of memory cells;
an input/output circuit for providing bi-directional communications and containing an output buffer circuit coupled to the array of memory cells, wherein the output buffer circuit comprises:
a pull-down output driver stage, comprising:
a first NMOS pull-down transistor coupled between a ground node and an output pad, and
second and third NMOS pull-down transistors coupled in cascode between the ground node and the output pad, the second NMOS pull-down transistor comprising a gate coupled to a gate of the first NMOS pull-down transistor;
a pull-up output driver stage, comprising:
a first PMOS pull-up transistor coupled between a power supply node and the output pad, and
second and third PMOS pull-up transistors coupled in cascode between the power supply node and the output pad, the second PMOS pull-up transistor comprising a gate coupled to a gate of the first PMOS pull-up transistor and the third PMOS pull-up transistor comprising a gate coupled to a gate of the third NMOS pull-down transistor;
a pull-up pre-driver stage coupled to the gate of the second PMOS pull-up transistor; and
a pull-down pre-driver stage coupled to the gate of the second NMOS pull-down transistor.

12. The memory device of claim 11, further comprising at least one programmable interconnect to selectively configure the output buffer to operate at a plurality of predetermined supply voltage ranges.

13. The memory device of claim 12, wherein the at least one programmable interconnect is programmable during fabrication using a metal mask option.

14. The memory device of claim 13, wherein the predetermined supply voltage range comprises 1.6-3.3V.

15. The memory device of claim 13, wherein the predetermined supply voltage range comprises an extended low-voltage range for a cellular telephone.

16. The memory device of claim 11, further comprising at least one programmable interconnect to adjust disoverlap of signal level inputs to pull-up and pull-down sections of the output buffer.

17. A memory device, comprising:
an array of memory cells;
an input/output circuit for providing bi-directional communications and containing an output buffer circuit coupled to the array of memory cells, wherein the output buffer circuit comprises:
a pull-up driver stage coupled to receive a first signal for coupling an output node of the output buffer to a supply potential node in response to the first signal having a first logic level and for presenting a high impedance to the output node in response to the first signal having a second logic level; and
a pull-down driver stage coupled to receive a second signal for coupling the output node to a ground potential node in response to the second signal having the second logic level and for presenting a high impedance to the output node in response to the second signal having a first logic level;
wherein the pull-up driver stage comprises at least two cascode-connected transistors coupled between the supply potential node and the output node with at least one of its cascode-connected transistors coupled to receive the first signal on its gate and at least one of its cascode-connected transistors having its gate coupled to the output node; and
wherein the pull-down driver stage comprises at least two cascode-connected transistors coupled between the ground potential node and the output node with at least one of its cascode-connected transistors coupled to receive the second signal on its gate and at least one of its cascode-connected transistors having its gate coupled to the output node.

18. The memory device of claim 17, wherein the pull-up driver stage further comprises:
at least one transistor coupled in parallel with its cascode-connected transistors between the supply potential node and the output node and having its gate coupled to receive the first signal.

19. The memory device of claim 17, wherein the pull-down driver stage further comprises:
at least one transistor coupled in parallel with its cascode-connected transistors between the ground potential node and the output node and having its gate coupled to receive the second signal.

20. A memory device, comprising:
an array of memory cells;
an input/output circuit for providing bi-directional communications and containing an output buffer circuit coupled to the array of memory cells, wherein the output buffer circuit comprises:
a pull-up pre-driver section coupled to receive a first signal indicative of a data value of a memory cell of the array;
a pull-down pre-driver section coupled to receive a second signal indicative of the data value of the memory cell of the array, wherein the first signal and the second signal are generally of the same logic level;
a pull-up driver stage coupled to receive an output signal from the pull-up pre-driver section for coupling an output node of the output buffer circuit to a supply potential node in response to the first signal having a first logic level and for presenting a high impedance to the output node of the output buffer circuit in response to the first signal having a second logic level; and
a pull-down driver stage coupled to receive an output signal from the pull-down pre-driver section for coupling the output node of the output buffer circuit to a ground potential node in response to the second signal having the second logic level and for presenting a high impedance to the output node of the output buffer circuit in response to the second signal having a first logic level;
wherein each driver stage comprises feedback circuitry to dynamically control an impedance of the output buffer in response to a load condition between the output buffer and the processor.

21. The memory device of claim 20, wherein the feedback circuitry for the pull-up driver stage comprises a cascode-connected transistor coupled between the supply potential node and the output node of the output buffer circuit and wherein a gate of the cascode-connected transistor is coupled to the output node of the output buffer circuit.

22. The memory device of claim 20, wherein the feedback circuitry for the pull-down driver stage comprises a cascode-connected transistor coupled between the ground potential node and the output node of the output buffer circuit and wherein a gate of the cascode-connected transistor is coupled to the output node of the output buffer circuit.

23. The memory device of claim 20, further comprising:
wherein the pull-up driver stage comprises at least two cascode-connected transistors coupled between the supply potential node and the output node of the output buffer circuit with at least one of its cascode-connected transistors coupled to receive the output signal from the pull-up pre-driver stage on its gate and at least one of its cascode-connected transistors having its gate coupled to the output node of the output buffer circuit; and
wherein the pull-down driver stage comprises at least two cascode-connected transistors coupled between the ground potential node and the output node of the output buffer circuit with at least one of its cascode-connected transistors coupled to receive the output signal from the pull-down pre-driver stage on its gate and at least one of its cascode-connected transistors having its gate coupled to the output node of the output buffer circuit.

24. An electronic system, comprising:
an array of non-volatile memory cells;
a processor; and
an input/output circuit for providing bi-directional communications between the processor and the array of non-volatile memory cells;
wherein the input/output circuit includes an output buffer comprising:
a driver stage comprising one or more drive transistors coupled to receive a signal representative of a data value of a memory cell of the array;
a pre-driver stage coupled to the driver stage; and
a feedback circuit to dynamically control output buffer impedance in response to a load condition;
wherein the feedback circuit comprises cascode-connected drive transistors.

25. The electronic system of claim 24, wherein the driver and pre-driver stages comprise pull-up and pull-down sections.

26. The electronic system of claim 25, further comprising one or more level shifter circuits.

27. The electronic system of claim 26, wherein the output buffer is selectively configurable for operation at a plurality of supply voltages.

28. The electronic system of claim 24, further comprising a programmable interconnect to calibrate a rate of change in a signal level input to a pull-up or pull-down section of the output buffer.

29. The electronic system of claim 24, wherein the output buffer further comprises a programmable interconnect to selectively configure the output buffer for operation at a predetermined supply voltage range.

30. The electronic system of claim 29, wherein the programmable interconnect is programmable after fabrication.

* * * * *

UNITED STATES PATENT AND TRADEMARK OFFICE
CERTIFICATE OF CORRECTION

PATENT NO. : 7,271,620 B2 Page 1 of 1
APPLICATION NO. : 11/601263
DATED : September 18, 2007
INVENTOR(S) : Gallo et al.

It is certified that error appears in the above-identified patent and that said Letters Patent is hereby corrected as shown below:

On the title page, item (54), in column 1, line 1, delete "IMPEDANCE" and insert -- IMPEDENCE --, therefor.

In column 1, line 1, delete "IMPEDANCE" and insert -- IMPEDENCE --, therefor.

Signed and Sealed this

Fourth Day of December, 2007

JON W. DUDAS
*Director of the United States Patent and Trademark Office*